United States Patent [19]

Schwabe et al.

[11] Patent Number: 4,505,027

[45] Date of Patent: Mar. 19, 1985

[54] METHOD OF MAKING MOS DEVICE USING METAL SILICIDES OR POLYSILICON FOR GATES AND IMPURITY SOURCE FOR ACTIVE REGIONS

[75] Inventors: Ulrich Schwabe; Franz Neppl; Ulf Bürker, all of Munich; Werner Christoph, Krailling, all of Fed. Rep. of Germany

[73] Assignee: Siemens Aktiengesellschaft, Berlin and Munich, Fed. Rep. of Germany

[21] Appl. No.: 575,138

[22] Filed: Jan. 30, 1984

[30] Foreign Application Priority Data

Feb. 10, 1983 [DE] Fed. Rep. of Germany ....... 3304588

[51] Int. Cl.³ .................... H01L 21/74; H01L 21/265
[52] U.S. Cl. .................................. 29/577 C; 29/571; 29/576 B; 29/578; 148/1.5; 148/187; 357/91
[58] Field of Search .................. 148/1.5, 187; 29/571, 29/576 B, 578, 577 C; 357/91

[56] References Cited

U.S. PATENT DOCUMENTS

| 4,305,200 | 12/1981 | Fu et al. | 29/571 |
| 4,319,395 | 3/1982 | Lund et al. | 148/1.5 |
| 4,339,869 | 7/1982 | Reihl et al. | 29/576 B |
| 4,364,166 | 12/1982 | Crowder et al. | 29/571 |
| 4,399,605 | 8/1983 | Dash et al. | 29/571 |
| 4,411,734 | 10/1983 | Maa | 156/643 |
| 4,434,543 | 3/1984 | Schwabe et al. | 29/576 B |
| 4,442,591 | 4/1984 | Haken | 29/571 |
| 4,450,620 | 5/1984 | Fuls et al. | 148/1.5 |

OTHER PUBLICATIONS

Nagasawa et al., Jap. Jour, Appl. Phys. 22 (Jan. 1983) L-57-59.
De La Monada, IBM-TDB, 24 (1981) 3454.
Vossen, J. Vac. Sci. Technol. 19 (1981) 761.
Neppl et al., J. Electrochem. Soc. (May 1983) 1174.

Primary Examiner—Upendra Roy
Attorney, Agent, or Firm—Mark H. Jay

[57] ABSTRACT

The invention relates to a method for producing MOS transistors with flat source/drain zones, short channel lengths, and a self aligned contacting plane comprised of a metal silicide. In this method, the source/drain zones in the semiconductor substrate are produced by out-diffusion of the contacting plane consisting of a doped metal silicide and deposited directly on the substrate. The method serves to produce NMOS, PMOS, and in particular CMOS circuits in VLSI technology and permits a very high packing density and an independent additional wiring plane of very low resistance.

21 Claims, 17 Drawing Figures

METHOD OF MAKING MOS DEVICE USING METAL SILICIDES OR POLYSILICON FOR GATES AND IMPURITY SOURCE FOR ACTIVE REGIONS

BACKGROUND OF THE INVENTION

This invention relates to a method of producing MOS transistors with flat source/drain zones, short channel lengths, and a self aligning contacting plane consisting of a metal silicide.

Reducing the structure sizes of integrated MOS circuits requires diminishing the depth of penetration of the source/drain diffusion zones. Consequently, the series resistance increases considerably. This resistance decreases the current amplification of the transistor, so that, from a channel length of 1 to 0.5 microns and on a further miniaturization of the structure offers no advantage.

Possibilities for reducing the unacceptably high series resistance of the source/drain zones are provided by self-aligned silicide plating of these zones with platinum silicide as described in an article by Shibata et al. in IEEE, ED 29 (1982) at pages 531 to 535. After the source/drain implantation, $SiO_2$ is deposited from the gaseous phase and thereafter etched anisotropically, that is, with steep edges, so that an edge covering occurs at the gate edges (sidewall spacer oxide). Thereafter platinum is vapor deposited and sintered. Thus a silicide layer develops in self-alignment both on the gate electrode and on the source/drain zones.

The disadvantages of this method, other than the complicated process involved, are:

(a) consumption of silicon during the silicide plating, which may lead to short circuits to the substrate in case of shallow diffusion zones, (b) thermal stability is ensured for temperature lower than 700° C. only, and (c) a complicated metallization system with diffusion barrier is required and because of the multiple layer construction etching problems may occur.

Another possibility for reducing the source/drain series resistances is, as has been proposed in German patent application No. P 32 43 125.2, to produce self aligned poly-silicon contacts on the source/drain zones, the source/drain zones being formed by out-diffusion from the doped polysilicon layer which later serves as contact terminal.

SUMMARY OF THE INVENTION

The present invention solves the problem of reducing the surface resistance of the source/drain zones in VLSI (=very large scale integration) processes in a different manner and is characterized in that the source/drain zones in the silicon semiconductor substrate are produced by out-diffusion of the contacting plane consisting of a doped metal silicide which is deposited directly on the substrate. It is within the scope of the invention that the silicides of the metals tantalum, titanium, molybdenum or tungsten, are used as a metal silicide, and that the silicide depositon is conducted so that excess silicon is present. The excess of silicon can be produced, according to one embodiment by depositing polysilicon before the deposition of the metal silicide.

In acccordance with a further embodiment of the invention it is provided to carry out the doping of the metal silicide either by ion implantation after the metal silicide deposition or during the silicide deposition by reactive sputtering in an atmosphere containing the doping substance. When using only one doping substance—for example when producing NMOS transistors with arsenic—the doping can advantageously occur during sputtering by using doped silicide target.

The advantage of the method according to the invention over the method proposed in patent application P 32 43 125.2 is that with metal silicide, a much greater reduction of the series resistances in MOS field effect transistors is achieved than with doped polysilicon. As a result of the low resistance the metal silicide may be extended as wiring on thick oxide regions advantageously. As the conductivity of the metal silicide does not depend on the doping substance concentration, a relatively slight doping by out-diffusion is possible. This increases the "avalanche" breakdown voltage. Since in the decisive etching of the silicide structure a silicon on silicon etching does not need to be stopped because there are different materials present, namely silicon and metal silicide, an etching process of higher selectivity or at least an easier endpoint control is possible.

Other features and advantages of the invention will be apparent from the following description of the preferred embodiments and from the claims.

For a full understanding of the present invention, reference should now be made to the following detailed description of the preferred embodiments of the invention.

DETAILED DESCRIPTION

A preferred embodiment of the invention will now be described with reference to FIGS. 1 through 9 of the drawings.

Embodiment I

Figure 1:
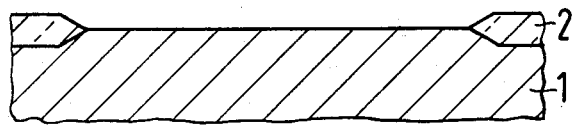
FIGS. 1 to 8 show, in sectional view, successive process steps essential to the invention, to produce a complete MOS transistor structure.

FIG. 1 shows the arrangement according to the steps of the LOCOS process for the definition of the active transistor regions by production of the field oxide regions 2 on the monocrystalline p-doped silicon substrate 1.

Figure 2:
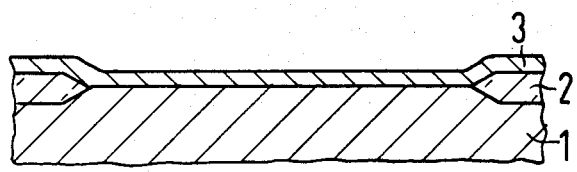

According to FIG. 2, on this arrangement (1, 2) a tantalum silicide layer 3 is deposited on the whole area in a layer of 200 nm thickness. This is done by sputtering, using a tantalum silicide target doped with arsenic (not shown in the figure) with a tantalum:silicon ratio of less than 1:2.

Then follows, as can be seen from FIG. 3, a whole-area deposition of an intermediate oxide layer of $SiO_2$ of 100–500 nm thickness, which after carrying out photoresist steps (not shown in the figures) is structured with the underlying doped tantalum silicide layer 3 for the definition of the planned gate region (see double arrow 5) in such a way that the gate region 5 is bared and the layers 3, 4 lying over the later defined source/drain regions (7, 8) are left intact.

The structuring of the doped tantalum silicide layer 3 and of the overlying SiO$_2$ layer 4 is effected with a dry etching method. In it first the SiO$_2$ layer 4 and then the doped tantalum silicide 3 on the monocrystalline silicon substrate 1 are etched away. There results the arrangement according to FIG. 4, from which it can be seen that the etching process creates vertical profiles.

Figure 5:
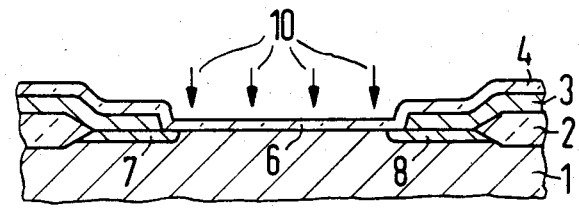

FIG. 5 shows the arrangement after the gate oxide 6 has been produced, also the silicide edges being oxidized and the source/drain zones 7, 8 being diffused out of the arsenic-doped tantalum silicide layer 3 at a temperature of 800°-1000° C. The arrows indicate the channel implantation with boron.

Figure 6:
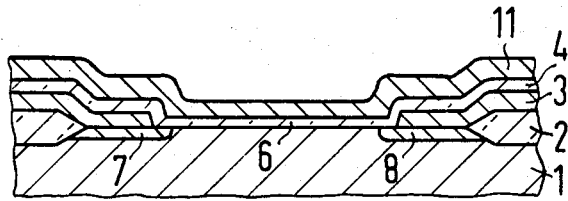
Figure 7:
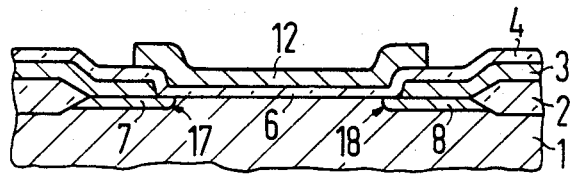

According to FIG. 6, a polysilicon layer 11 doped with phosphorus, arsenic or antimony is shown deposited on the whole area and, as can be seen from FIG. 7, is structured in the gate region 5 in such a way that the resulting gate electrode 12 overlaps the edge regions of the source/drain zones 7, 8 formed by out diffusion (see arrows 17, 18).

Figure 8:
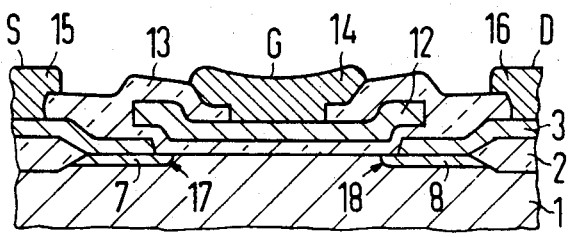

FIG. 8 shows the finished MOS transistor structure after deposition of an intermediate layer 13 serving as insulating oxide and after opening of the contact holes to the doped tantalum silicide zones 3 and the polysilicon zones 12, reference symbol 14 denoting the gate metallization, and 15 and 16, the source/drain contacts. The metallization occurs in known manner as contact metals aluminum or an aluminum-silicon alloy are used.

Embodiment II

Figure 9:
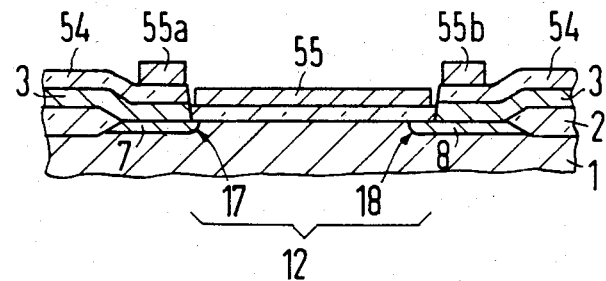
FIG. 9 shows another embodiment of the invention, in which the gate electrode is applied in self-alignment between the silicide structures.

FIG. 9 shows another advantageous embodiment of the invention, in which, as distinguished from FIG. 7 and 8, for minimum overlap capacities the transfer gate (12 in FIG. 7) is not made overlapping but, using the so-called lift-off technique, is introduced in self-alignment between the silicide structures 3. This is done as follows: Instead of the insulation layer consisting of SiO$_2$ (4 according to FIGS. 3 to 7), an insulation layer 54 consisting of silicon nitride is applied, and instead of the polysilicon layer forming the gate (12) (11 according to FIG. 6), a metal silicide layer 55 is used. During vapor deposition of this metal silicide layer 55, which may consist for example of tantalum silicide (TaSi$_2$), the connection at the silicon nitride edges in the gate region 12 necessarily breaks off.

FIG. 9 shows the arrangement after the structurization of the gate electrode (as in FIG. 7). The partial structures 55a and 55b present on the nitride layer 54 are removed by lifting off upon the removal of the nitride layer 54, using an isotropic etching method. Then the insulation oxide is produced (not shown), the contact holes for the conductor tracks are etched and the metallization is carried out.

The methods are applicable in analogous manner also to p-channel MOS transistors if instead of an arsenic-doped target a boron-doped target (is used) or a boron ion implantation of the tantalum silicide layer is carried out.

Further embodiments are described with reference to FIGS. 10 to 17 of the drawings.

Embodiment III

Figure 10:
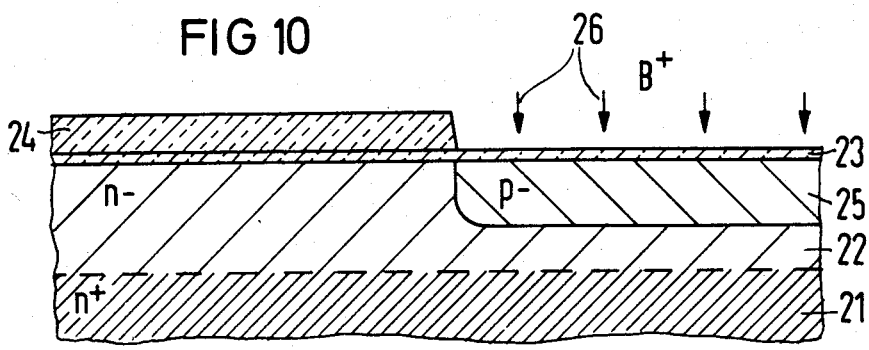
FIGS. 10 to 17 show the process steps essential in the production of a CMOS transistor circuit with "buried" contacts, for which the method according to the teaching of the invention is especially well suited because with the silicide a "buried" contact in p- and in n-channel transistors is possible, while this is true only for n-channel transistors when using polysilicon.

FIG. 10: At the beginning of the process sequence the p-well (25) is produced. The process begins with an n+-doped substrate 21 (<100>-Si, 0.01 to 0.1 Ohm cm) provided with an n-doped epitactic layer 22 (<100>-Si, 10 to 50 Ohm cm), which substrate is provided with an oxide layer 23 (50 nm) and with a silicon nitride layer 24 of a thickness of 100 nm, structured by means of a photoresist technique (not shown). The boron ion implantation 26 for the production of the p-well 25 is effected with a dose and energy of $1.5 \times 10^{12}$ cm$^{-2}$ or respectively 160 KeV.

Figure 11:
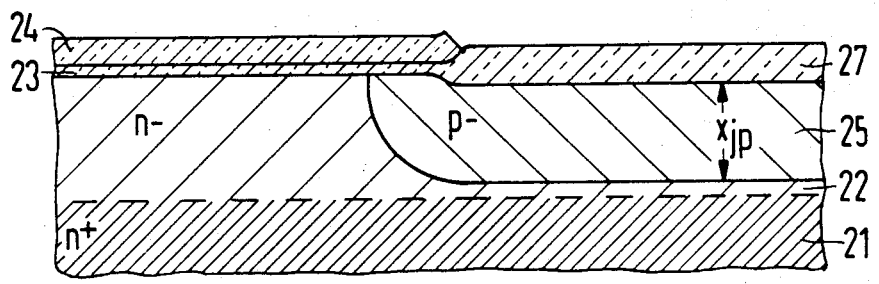

FIG. 11: After the oxide layer 23 has been detached, (an underetching of the silicon nitride layer 24 being carried out in a controlled manner) an oxidation process takes place. The newly produced oxide layer is marked 27 and has a thickness of 400 nm. In a following diffusion process, the boron ions are diffused into the epitactic layer 22 to a depth of penetration $x_{jp}$ of 6 microns. The thickness of the epitactic layer 22 is 7 microns.

Figure 12:
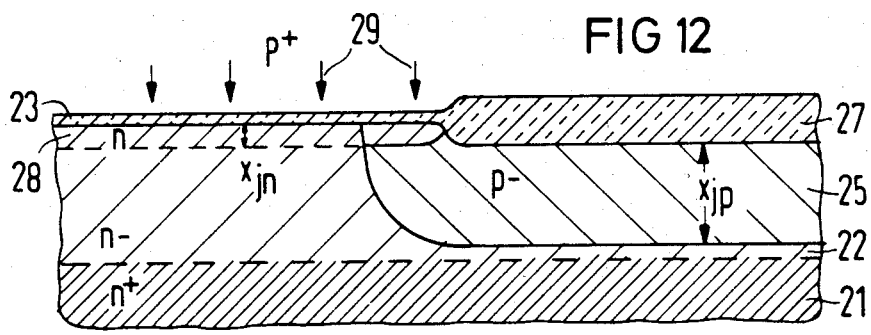

FIG. 12: The silicon nitride layer 24 is removed. The production of the n-well 28 is carried out by a whole-area phosphorous or arsenic ion implantation 29 with an implantation dose and energy of $9 \times 10^{11}$ cm$^{-2}$ or respectively 60 KeV and subsequent diffusion to a depth pentration of $X_{jn}$ of 1 to 1.5 microns. Due to the high implantation dose, the field ion implantation for the adjustment of the cutoff voltage of the p-channel thick oxide transistors and hence an additional mask can be saved.

Figure 13:
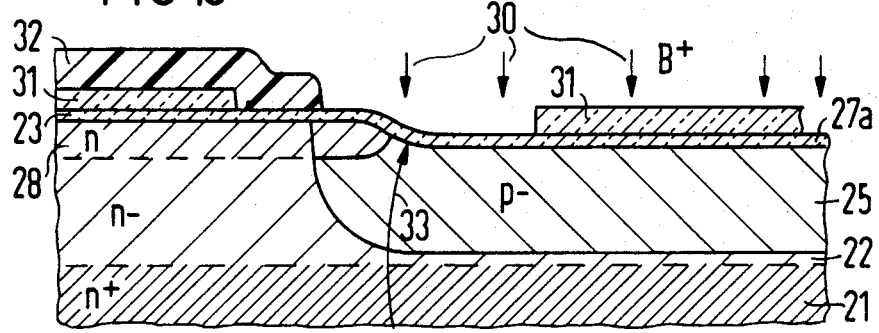

FIG. 13: After the introduction of the phosphoros or arsenic ions into the n-well 28, the oxide layer is etched off: then follow the oxidation of the layer 27a (50 nm) and the silicon nitride deposition 31 in a layer thickness of 120 nm and the structuring of the silicon nitride layer (LOCOS mask). The field implantation of the p-well 25 with boron ions occurs after masking of the n-well 28 and of the entire transistor region of the n-channel transistors in the p-well 25 of the silicon nitride layer 31. All regions except the p-well regions are covered with a photoresist structure 32 during the boron ion implantation 30. The implantation dose and energy of the boron ion implantation 30 is adjusted to $1 \times 10^{13}$ cm$^{-2}$ and 25 KeV. The surface edge indicated by the arrow 33 in FIG. 12 is neglected in the following figures.

Figure 14:
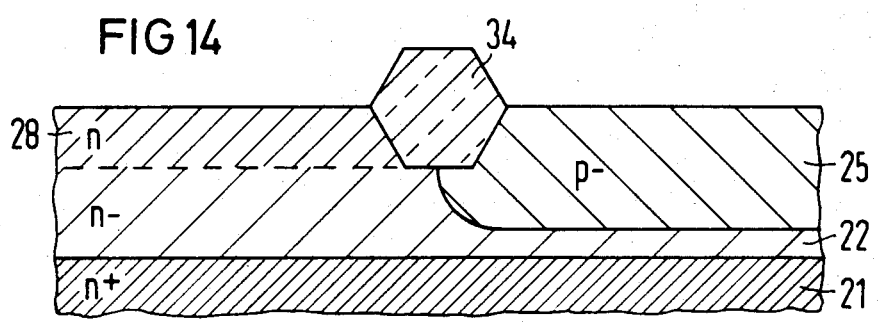

FIG. 14: After removal of the photoresist structure 32, the field oxide regions 34 are then produced in a layer thickness of 1000 nm by local oxidation, using the silicon nitride layer 31 as mask. After detachment of the silicon nitride layer 31, also the thin oxide (23, 27) present under the silicon nitride layer 31 is removed, the arrangement shown in FIG. 13 being formed.

Figure 15:
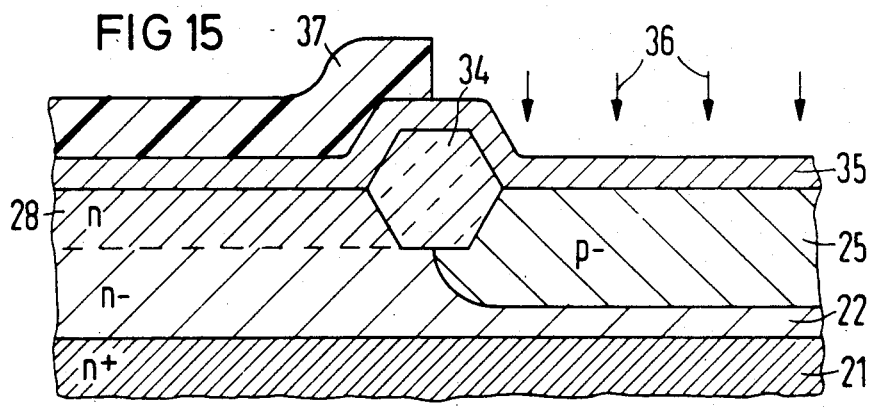

FIG. 15: Subsequently, there is prescribed a whole-area deposition of a metal silicide layer 35 consisting of tantalum and silicon (or titanium, molybdenum or tungsten and silicon), in a layer thickness of 200 nm, the deposition being conducted so that silicon is in excess with respect to the stoichiometry, to permit reoxidation. This can be achieved also be pre-deposition of pure silicon. The tantalum silicide layer 35 is then doped with an arsenic ion implantation 36 ($5 \times 10^{15}$ cm$^{-2}$, 80 KeV), the n-well region 28 having previously been covered with a photoresist mask 37.

Figure 16:
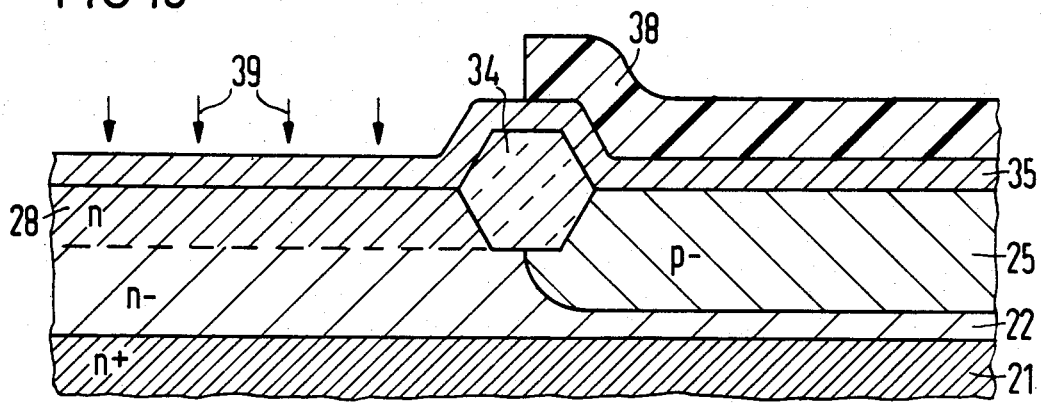

FIG. 16: After removal of the photoresist mask 37, an additional photoresist mask 38 is applied in the p-well region 25, and thereafter the tantalum silicide layer 35 in the n-well region is doped by implantation of boron ions 39 ($5 \times 10^{15}$ cm$^{-2}$, 25 KeV). The photoresist mask 39 is removed after the doping.

Figure 3:
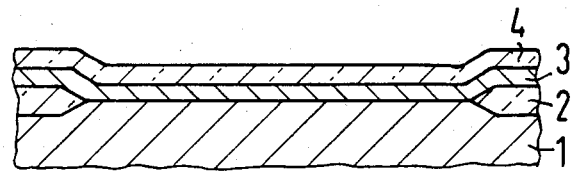
Figure 4:
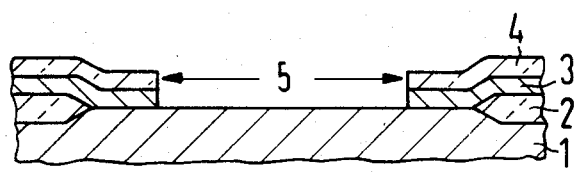

Now, as has been described in detail in the first embodiment in FIGS. 3 to 5, a photoresist technique is carried out for the definition of the gate regions, the photoresist mask covering the metal silicide layer 35 lying over the source/drain regions and the overlying SiO$_2$ layer 52, with the exception of the gate regions. By means of a dry etching process (also as described in the first embodiment) the metal silicide layer 35 is structured with the overlying SiO$_2$ layer 52 in the source/drain regions, the gate regions being bared. There result the tantalum silicide layer structures marked with the reference symbol 35 in FIG. 16.

Figure 17:
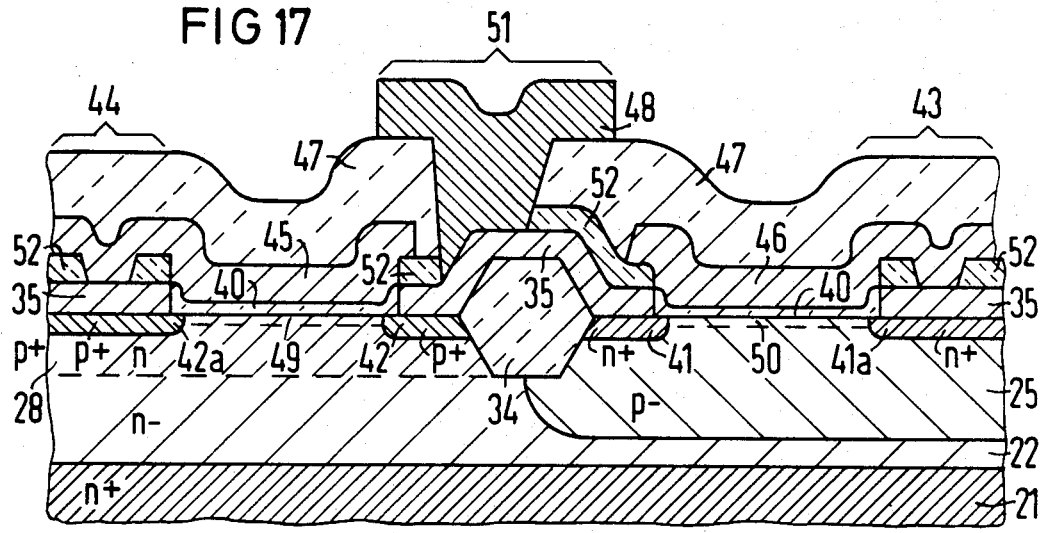

FIG. 17: For the out-diffusion of the doping substances (boron and arsenic) contained in the tantalum silicide layer structures (35) and for the production of the gate oxide 40, a heat treatment is now carried out at 900° C. The source/drain regions 41 (n+) and 53 (p+) are thus formed, and the silicide edges are oxidized by implantation of boron ions, the channel zones 49, 50 are produced in the gate regions (45, 46) and subsequently contacts to the p+- (42a) and n+- (41a) -doped zones (41a, 42a) are opened (so-called "buried" contacts 43, 44). Then the polysilicon layer which forms the gate electrodes 45, 46 and the "buried" contacts 43, 44 is deposited on the whole area, and this layer is structured so that the gate electrodes 45, 46 and the "buried" contact 43, 44 overlap the source/drain regions 41 and 42.

After an intermediate layer 47 serving as insulation oxide has been produced, the contact holes to the metal silicide layer structures 35 covering the source/drain regions 41, 42 are opened, and the contact conductor track plane 48 consisting of aluminum is formed.

The brackets denoted by 43, 44 and 51 have the following meaning:

43 shows the "buried" contact on the n+-doped zone 41a;

44 shows the "buried" contact on the p+-doped zone 42a; and 51 shows the region of the ovelapping aluminum contact 48 on the source/drain zone 41, 42.

Due to the proposed silicide process in the production of a CMOS transistor circuit there results the following device-relevant advantages over known arrangements:

1. The source/drain zones (41, 42) have a resistance lower by an order of magnitude.

2. An almost independent, additional, low-resistance wiring through silicide (35) at no extra expense is obtained.

3. Overlapping contacts (51) from the aluminum plane (48) to the source/drain zones (41, 42) and possible size reduction of the source/drain regions in lower "junction" capacities and higher packing density.

4. Since the channel implantation (49, 50) can be effected after the silicide structurization and hence really only in the channel region itself, lower, "junction" capacities and "avalanche" susceptibility occur.

5. Since a slight doping of the source/drain zones is possible, there is less "avalanche" susceptibility and shallower diffusion zones form.

6. With CMOS a direct connection between n+ source/drain (43) and p+ source/drain zones (44) through silicide is possible, whereby a space-saving design is created.

7. This design is made possible also by the "buried" contacts both to p+ and to n+ regions.

8. The process is readily modifiable to a latch-up-free CMOS process with Schottky MOSFETs. To this end it suffices to omit the silicide doping, for example in the p-channel transistor region.

There has thus been shown and described a novel method of producing MOS transistors which fulfills all the objects and advantages sought therefor. Many changes, modifications, variations and other uses and applications of the subject invention will, however, become apparent to those skilled in the art after considering the specification and the accompanying drawings which disclose preferred embodiments thereof. All such changes, modifications, variations and other uses and applications which do not depart from the spirit and scope of the invention are deemed to be covered by the invention which is limited only by the claims which follow.

What is claimed is:

1. Method of producing MOS transistor with flat source/drain zones, short channel lengths, and a self-aligned contacting plane comprised of a metal silicide, wherein said method comprises the step of: producing said source/drain zones in a silicon semiconductor substrate by out-diffusion of said contacting plane, said contacting plane comprising a doped metal silicide and being deposited directly on said substrate..

2. Method according to claim 1, wherein said metal silicide may comprise silicides of the metals tantalum, titanium, molybdenum and tungsten and wherein silicide depositing is conducted so that silicon is present in excess.

3. Method according to claim 1, wherein an excess of silicon is produced by depositing polysilicon before the depositing of the metal silicide.

4. Method according to claim 1, wherein the doping of said doped metal silicide is carried out by ion implantation after the metal silicide deposition.

5. Method according to claim 1, wherein the doping of the metal silicide in the silicide deposition is effected by reactive sputtering of undoped silicon in an atmosphere containing doping substance.

6. Method according to claim 1, wherein the doping of the metal silicide is effected by sputtering, using a doped silicide target.

7. Method of producing integrated MOS transistor circuits according to claim 1, wherein said method comprises the steps of:

(a) producing structured SiO$_2$ layers on a silicon semiconductor substrate of a first conductivity type to separate active transistor regions by the so-called LOCOS or isoplanar process;

(b) depositing over a whole-area a metal silicide layer provided with doping substance ions of a second conductivity type;

(c) depositing over a whole-area an insulation layer consisting of SiO$_2$;

(d) performing a photoresist technique for the definition of the gate regions, the photoresist mask covering the metal silicide layer lying over said source/drain regions and the SiO$_2$ layer thereabove, with the exception of said gate region;

(e) executing a dry etching process for structuring the metal silicide layer and the SiO$_2$ layer thereabove, the gate region being bared thereby;

(f) executing a heat treatment to produce a gate oxide and the source/drain regions by executing said out-diffusion of claim 1 of doping substances of the second conductivity type contained in the metal silicide layer;

(g) producing a channel zone in the gate region by implantation of doping substances of said first conductivity type;

(h) depositing over a whole-area a polysilicon layer doped with doping substances of the second conductivity type;

(i) structuring the polysilicon layer in the gate region so that the formed gate electrode overlaps the source/drain zones;

(j) producing an intermediate layer serving as insulation oxide; and (k) opening of contact holes to the metal silicide or polysilicon regions and performing the metalization of said integrated MOS circuit.

8. Method according to claim 1, wherein boron is used as a doping substance for the metal silicide layer.

9. Method according to claim 1, wherein arsenic is used as a doping substance for the metal silicide layer.

10. Method according to claim 1, wherein phosphorus is used as a doping substance for the metal silicide layer.

11. Method of producing circuits containing p- and n-channel MOS transistors (CMOS circuits) in VLSI technology according to the general step of claim 1, wherein said method comprises the steps of:

(a) producing a p-well by a boron ion implantation in an n-doped epitactic layer applied on an n+-doped substrate and covered with an oxide layer after the other regions have been masked with a silicon nitride mask;

(b) detaching the oxide layer, an under-etching of the silicon nitride layer being carried out in a controlled manner;

(c) executing a local oxidation process and in-diffusion of boron ions to a depth of penetration $x_{jp}$ which is in the range of the thickness of said epitactic layer;

(d) detaching said silicon nitride masking;

(e) producing a n-well by a phosphorus or arsenic ion implantation and subsequent diffusion in a much smaller depth of penetration $x_{jn}$ than of said p-well ($x_{jp}$), with $x_{jp} \geq 4x_{jp}$;

(f) executing the field implantation for the n-channel transistors in the region of the p-well after masking of the n-well by means of a silicon nitride and photoresist layer and of the entire transistor region of the n-channel transistors in the p-well with a silicon nitride layer;

(g) producing the field oxide regions by means of local oxidation using the silicon nitride layer as masking;

(h) removing the silicon nitride masking and etching away the silicon oxide present under the silicon nitride masking;

(i) whole-area depositing of the contacting plane comprising a metal silicide, the deposition being conducted so that silicon is present in excess, to permit reoxidation;

(j) arsenic ion implanting of the metal silicide layer in the p-well region after completed photoresist masking of the n-well region;

(k) boron ion implanting of the metal silicide layer in the n-well region after detachment of the photoresist mask and completion of photoresist masking of the p-well region;

(l) whole-area depositing of an insulation layer of $SiO_2$;

(m) executing a photoresist technique for the definition of the gate regions, the photoresist mask covering the metal silicide layer over the source/drain regions and the $SiO_2$ layer thereabove, with the exception of the gate regions;

(n) executing a dry etching process for structuring the metal silicide layer and the $SiO_2$ layer thereabove in the source/drain regions, the gate regions being bared thereby;

(o) executing a heat treatment for the production of the gate oxide and of the source/drain regions by out-diffusion of the doping substances contained in the metal silicide layer;

(p) producing a channel zone in the gate regions by implantation of boron;

(q) opening the contacts to the p+ and n+ doped zones ("buried" contacts);

(r) whole-area depositing of the layer forming the gate electrodes and the "buried" contacts;

(s) structuring of the gate electrodes and of the "buried" contacts so that source/drain regions are overlapped;

(t) producing an intermediate layer serving as insulation oxide; and (u) opening the contact holes to the metal silicide layer structures covering the source/drain zones and executing the metallization of the circuit.

12. Method according to claim 2, wherein the doping of said doped metal silicide is carried out by ion implantation after the metal silicide deposition.

13. Method according to claim 2, wherein the doping of the metal silicide in the silicide deposition is effected by reactive sputtering of undoped silicon in an atmosphere containing doping substance.

14. Method according to claim 2, wherein the doping of the metal silicide is effected by sputtering, using a doped silicide target.

15. Method according to claim 3, wherein the doping of said doped metal the silicide is carried out by ion implantation after the metal silicide deposition.

16. Method according to claim 3, wherein the doping of the metal silicide in the silicide deposition is effected by reactive sputtering of undoped silicon in an atmosphere containing doping substance.

17. Method according to claim 3, wherein the doping of the metal silicide is effected by sputtering, using a doped silicide target.

18. Method according to claim 7, wherein according to step (c) silicon nitride is used as insulation layer; instead of the process step (h) a metal silicide or metal layer forming the gate is vapor deposited on the whole-area, the connection of the metal silicide or metal layer being interrupted at the nitride layer edge; and wherein after the structurization of the gate electrode according to step (i) the silicon nitride layer is removed by isotropic etching, the metal silicide or metal layer structures present thereon being lifted off as well.

19. Method according to claim 11, wherein polysilicon, metals and/or metal silicide are used for the whole-area depositing of the layer forming the gate electrodes and the "buried" contacts according to step (r).

20. Method according to claim 11, wherein the metallization according to step (u) is carried out with aluminum as contact conductor track plane.

21. Method according to claim 19, wherein the metallization according to step (u) is carried out with aluminum as contact conductor track plane.

* * * * *